United States Patent [19]

Self

[11] Patent Number: 5,175,512

[45] Date of Patent: Dec. 29, 1992

[54] HIGH SPEED, POWER SUPPLY INDEPENDENT CMOS VOLTAGE CONTROLLED RING OSCILLATOR WITH LEVEL SHIFTING CIRCUIT

[75] Inventor: Paul W. Self, Santa Clara, Calif.

[73] Assignee: Avasem Corporation, San Jose, Calif.

[21] Appl. No.: 843,703

[22] Filed: Feb. 28, 1992

[51] Int. Cl.[5] .................. H03B 5/04; H03K 17/693; H03K 19/0185

[52] U.S. Cl. .......................... 331/57; 331/8; 331/34; 331/74; 331/186; 307/475

[58] Field of Search .............. 331/57, 74, 75, 185, 331/186, 8, 34; 307/475

[56] References Cited

U.S. PATENT DOCUMENTS

| | | | |
|---|---|---|---|
| 4,527,247 | 7/1985 | Kaiser et al. | 364/550 |
| 4,590,444 | 5/1986 | Wilcox | 331/111 |
| 4,845,381 | 7/1989 | Cuevas | 307/475 |
| 4,910,471 | 3/1990 | Brahmbhatt et al. | 331/57 |
| 4,922,140 | 5/1990 | Gahle et al. | 307/591 |
| 5,029,183 | 7/1991 | Tymes | 375/1 |
| 5,061,907 | 10/1991 | Rasmussen | 331/57 |
| 5,081,428 | 1/1992 | Atriss et al. | 331/57 |

OTHER PUBLICATIONS

Scott, "A 16 Mb/s Data Detector and Timing Recovery Circuit for Token Ring LAN," IEEE Inat'l S—S Circuits Conf., Feb. 16, 1989, p. 150.

Blair, "A 16-Mbit/s Adapter Chip for the IBM Token--Ring LAN," IEEE J. Solid-State Circuits, vol. 24, No. 6, pp. 1647-1655, Dec. 1989.

Ware, "A 200-MHz CMOS Phase-Locked Loop with Dual Phase Detectors," IEEE J. Solid-State Circuits, vol. 24, No. 6, p. 1560, Dec. 1989.

Kim, "A 30-MHz Hybrid Analog/Digital Clock Recovery Circuit in 2-$\mu$m CMOS," IEEE J. Solid-State Circuits, vol. 25, No. 6, pp. 1385, Dec. 1990.

Primary Examiner—Siegfried H. Grimm
Attorney, Agent, or Firm—Townsend and Townsend

[57] ABSTRACT

A high speed voltage controlled oscillator (VCO) providing for low sensitivity to the noise on the integrated circuit's (IC) power supply. The VCO circuit creates a supply voltage for a ring oscillator independent of the IC's power supply thereby controlling the frequency of operation independent of variations on the IC's power supply. A high speed CMOS level shifting circuit provides for converting outputs of the VCO with low logic level and varying frequencies to a signal with a full CMOS logic level and low duty cycle distortion.

9 Claims, 3 Drawing Sheets

HIGH SPEED, POWER SUPPLY INDEPENDENT CMOS VOLTAGE CONTROLLED RING OSCILLATOR WITH LEVEL SHIFTING CIRCUIT

BACKGROUND OF THE INVENTION

In video graphics applications, phase locked loops (PLLs) are used for generating video clocks. A main requirement of the output clock of a video PLL is low jitter. High frequency CMOS voltage controlled oscillators (VCOs) used in video PLLs have been sensitive to electrical noise on an integrated circuit's (IC's) power supply. Therefore, to maintain an adequately low amount of jitter in the video clock output, such VCO ICs have required numerous external components for power supply filtering. These external devices have added to the size and cost of the final product.

Furthermore, the output signal of a high frequency VCO circuit may require a level shifting circuit to convert the signal to one with well defined logic levels. Often it is necessary to convert signals which have a lower voltage, high logic level to signals that have a higher voltage high logic level. If the lower voltage, high logic level is well defined, invariant, and well exceeds transistor thresholds for CMOS processes, relatively simple circuits can be used to perform the level shifting. A CMOS circuit that converts TTL level logic signals up to CMOS logic levels is one example of a relatively simple level shifter.

However, if the lower voltage high logical level is not well-defined, is variable, and may not exceed a N-channel device threshold substantially, a simple TTL level shifter will often not work satisfactorily. Since the input level may not substantially exceed a device threshold, the TTL level shifter will either not function at all, or will greatly distort the duty cycle of the input signal. Also, if the input high logic level goes up in value and the frequency rises to a very high rate, a simple TTL level shifter in most cases will not be fast enough to handle the input signal. The output of a high frequency VCO is an example of a variable, not well-defined low voltage high logical level signal with varying frequencies. Therefore in such applications highly sensitive level shifting circuits capable of converting signals with varying frequencies are desired.

SUMMARY OF THE INVENTION

The present invention reduces the number of, and therefore the cost associated with, external components required for power supply filtering by providing for a high frequency CMOS VCO with significant reduction in sensitivity to the noise on the IC's power supply. This invention reduces the VCO's sensitivity to noise on the IC's power supply by creating a supply voltage for a ring oscillator that is substantially independent of the IC's power supply.

An improved ring oscillator is also provided. The ring oscillator formed by using only a small number, such as five, of fast inverters allows the oscillator to achieve higher frequencies of operation.

Furthermore, the present invention provides for a level shifting circuit that is capable of converting not well-defined low level signals with varying frequencies to a signal with full CMOS logic levels and low duty cycle distortion.

Accordingly, in one embodiment, the present invention provides a high speed voltage controlled oscillator comprising a ring oscillator circuit coupled between a variable supply terminal and a grounding means, a variable voltage at the variable supply terminal controlling a frequency of oscillation; and a voltage control circuit coupled between a fixed power supply terminal and a grounding means, having an input terminal referenced to a ground terminal and an output terminal coupled to the variable supply terminal; wherein a voltage at the input terminal controls a voltage at the variable supply terminal, substantially independently of the fixed power supply.

In another embodiment, the present invention provides a high speed level shifting circuit comprising a first pre-amplifier having an input terminal of first polarity and a first output, a second preamplifier having an input terminal of opposite polarity and a second output; an output stage having two inputs coupled to the pre-amplifiers' first and second outputs and including a positive feedback latch having a circuit output; and a bias current adjust circuit having a control input and a bias voltage output, the bias voltage output adjusting a bias current for the pre-amplifiers.

A further understanding of the present invention may be had with reference to the description and diagrams below.

DESCRIPTION OF THE PREFERRED EMBODIMENT

Figure 1:
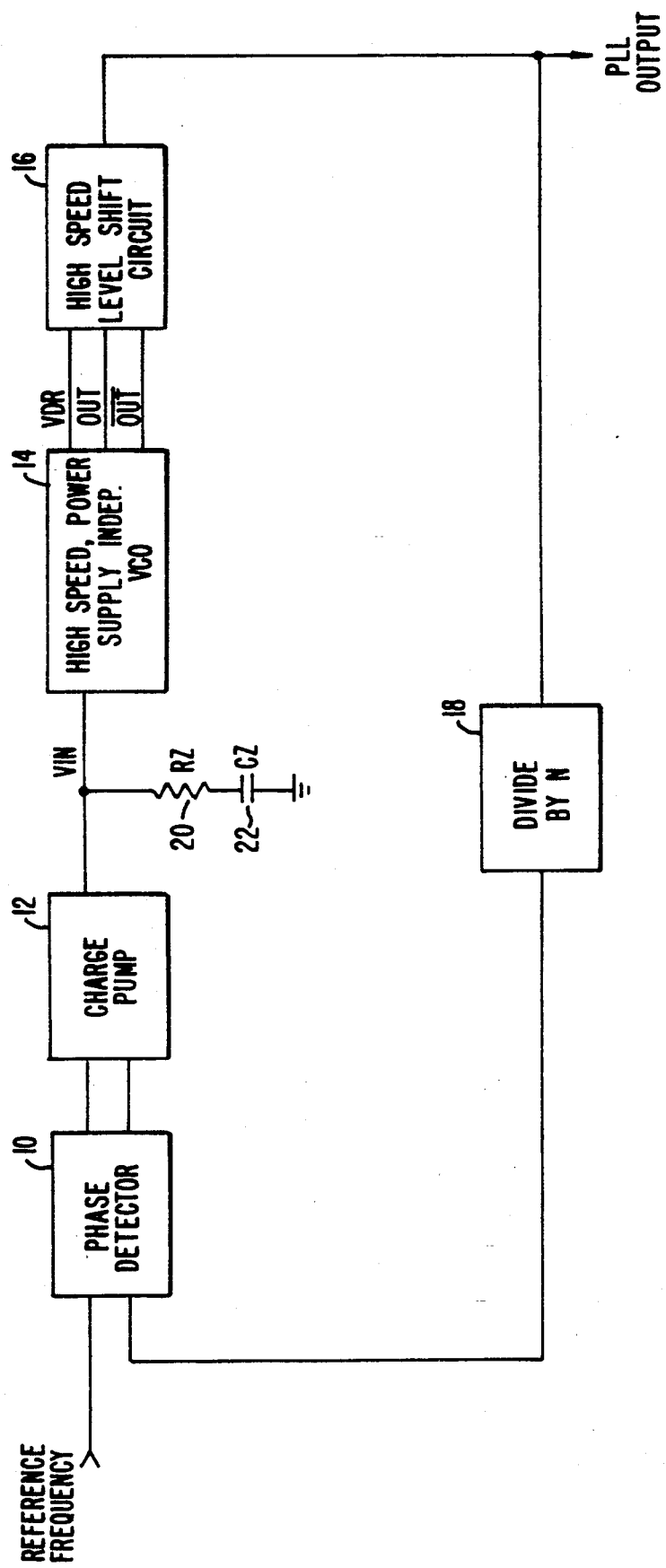
FIG. 1 is a block diagram of a high frequency phase locked loop.

FIG. 1 illustrates a block diagram of a phase locked loop (PLL) especially for video graphics applications. The PLL includes a phase detector 10 that receives at one input a loop frequency and at another a reference frequency. The phase detector 10 detects a difference in the phases of the two signals and at its output feeds that information to a charge pump block 12. The charge pump block 12 generates a voltage at its output labeled VIN. The signal at VIN is referenced to a ground terminal via resistor RZ 20 and capacitor CZ 22. The signal at VIN is coupled into an input of a voltage controlled oscillator (VCO) block 14. The high speed, power supply independent VCO 14 is one embodiment of the present invention. The VCO 14 receives a voltage at VIN, which is referenced to ground, and generates a voltage VDR that is substantially independent of the power supply for the integrated circuit. The VCO 14 also generates a signal with a frequency based on the voltage at VDR. This signal labeled OUT, and its complement $\overline{OUT}$ as well as the voltage at VDR are fed into a high speed level shifting circuit 16 which constitutes another aspect of the present invention. The output of the level shifting circuit 16 forms the output of the PLL. This output is also fed back to the loop frequency input of the phase detector 10 via a divide by N block 18.

Figure 2:
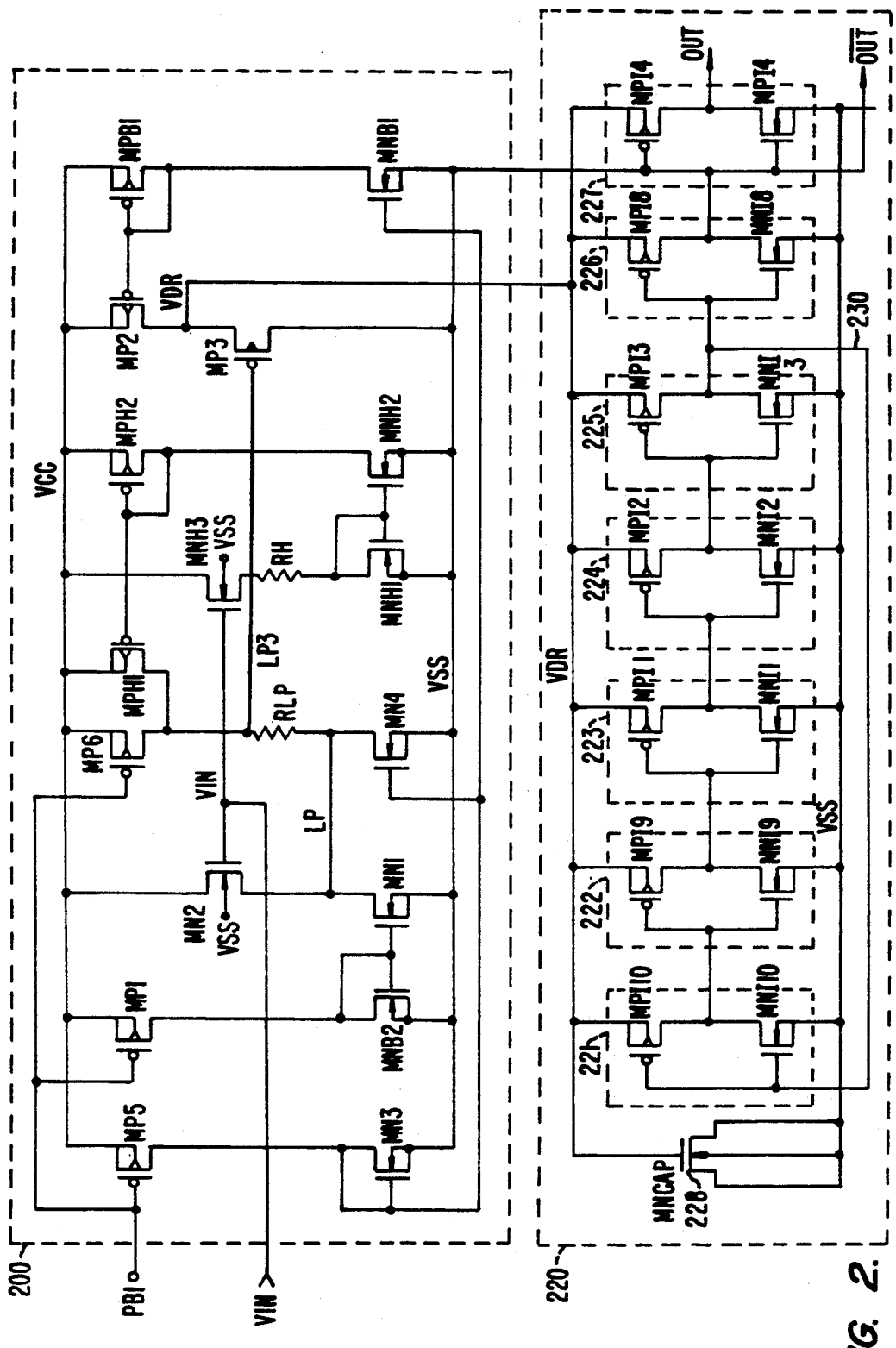
FIG. 2 is a circuit diagram of a high speed, power supply independent CMOS voltage controlled oscillator of the present invention.
Figure 3:
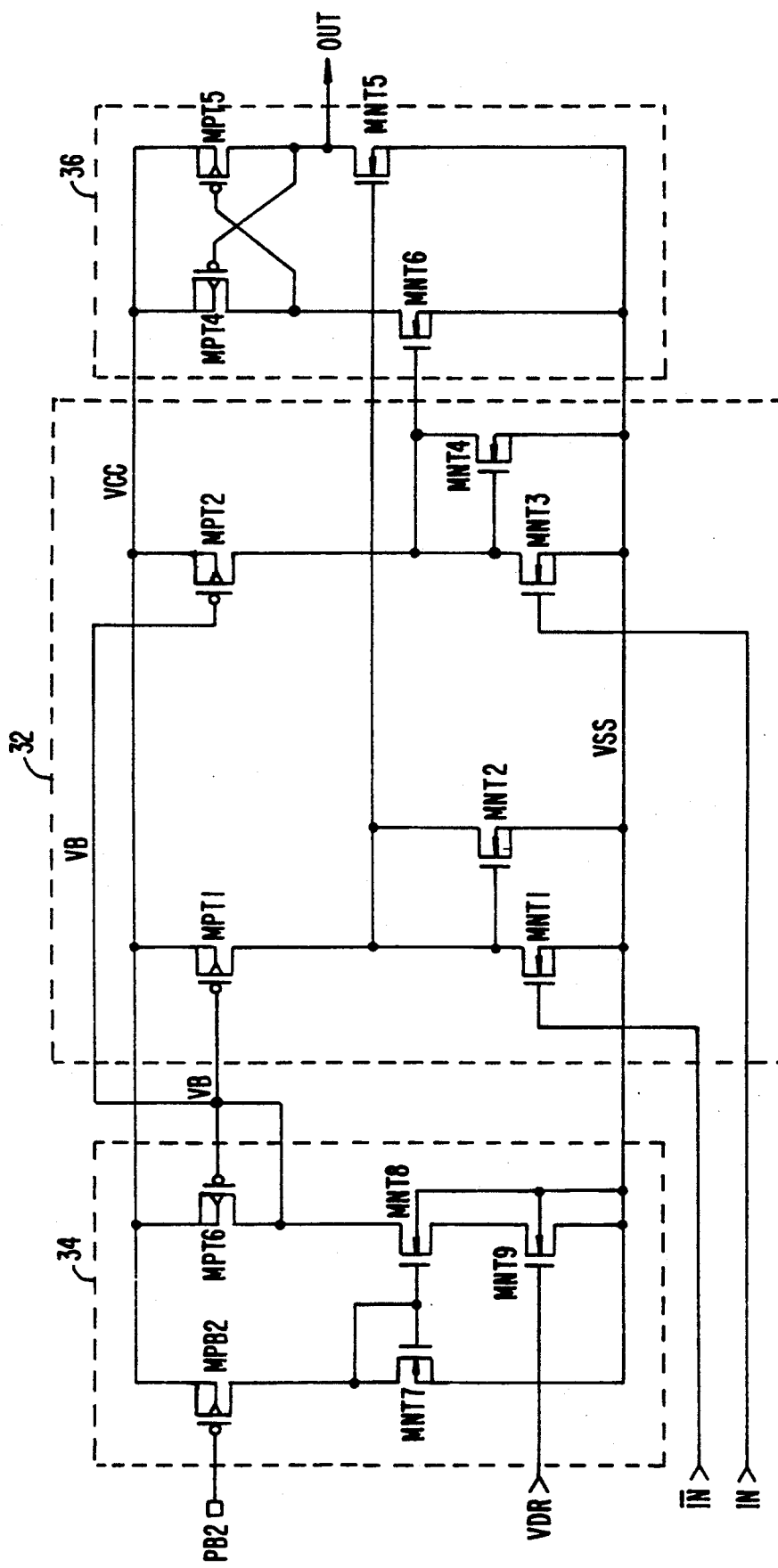
FIG. 3 is a circuit diagram of a high speed CMOS level shifting circuit for use with input signals that have varying high logic levels and frequency.

FIG. 2 is a circuit diagram of the VCO 14 according to one aspect of the invention. The VCO 14 includes a voltage control circuit 200 and an oscillator 220. The oscillator 220 includes five CMOS inverters 221 through 225 connected in series, with the output 230 of the fifth inverter 225 coupled to the input of the first inverter 221 to form a ring oscillator. Inverters 226 and 227 buffer the output 230 and also generate complementary outputs for the oscillator 220 at OUT and $\overline{\text{OUT}}$, which are also the outputs of the VCO 14. Device MNCAP 228 acts as a voltage supply bypass capacitor for the oscillator 220.

The value of the supply voltage VDR for the oscillator 220 determines the frequency of operation. As VDR is raised in voltage the output frequency of the oscillator 220 increases. Thus, a voltage controlled oscillator can be obtained by varying the supply voltage VDR of the oscillator 220. Because the oscillator 220 includes a ring of only five inverters, the VCO 14 is capable of very high frequencies. For example, for a 1.5 micron CMOS process, the VCO 14 can go above 200 MegHz at room temperature with a 5.0 volt supply.

The voltage control circuit 200 includes an input stage, a current boost circuit, and an output stage. The input stage includes a first N-channel input transistor MN2 which receives the input VIN at its gate. The drain of the first input transistor MN2 connects to the circuit power supply VCC and its source connects to the drain of a first pull-down N-channel transistor MN1. The bias current for the input stage is set by a first P-channel current source transistor MPI with its gate connected to bias voltage PB1, and a first diode connected N-channel transistor MNB2 with its gate connected to the gate of the first pull-down transistor MN1. The bias voltage PBI also connects to the gate of a second P-channel current source transistor MP6 with a source connecting to VCC and a drain connecting to a first node LP3. The first node LP3 also connects to one end of a first resistor RLP. The other end of the first resistor RLP, the second node LP, connects to the drain of a second N-channel pull-down transistor MN4. The second node LP also connects to the drain of the first pull-down transistor MN1.

The current boost circuit provides a parallel path to the input stage. A third P-channel current source transistor MPHI connects in parallel to the second current source transistor MP6. A second N-channel input transistor MNH3 receives the input VIN at its gate with its drain connected to VCC. The voltage at input VIN turns on the second input transistor MNH3 which controls the amount of current in a first biasing circuit for the third current source transistor MPH1. This first biasing circuit includes a second resistor RH, current mirroring N-channel transistors MNH1 and MNH2, and first P-channel bias transistor MPH2. The gate and drain of the first bias transistor MPH2 connects to the gate of the second current source transistor MPH1.

The output stage includes a P-channel output transistor MP3 with a gate connecting to first node LP3 and a drain connecting to the ground terminal VSS. The source terminal of output transistor MP3 connects to the output VDR and a drain of a P-channel load transistor MP2. The gate of the load transistor MP2 connects to the gate and drain of a second p-channel biasing transistor MPB1. The drain of the second biasing transistor MPB1 connects to a second biasing circuit that includes N-channel current mirror transistors MNB1 and MN3, and third P-channel current source transistor MP5. This second biasing circuit also provides the biasing for the second pull-down transistor MN4 of the input stage.

An independent bias circuit (not shown) generates the bias voltage at PB1. This bias voltage at PBI tracks the circuit's power supply VCC such that the amount of current in each of the current source transistors MP1, Mp5 and Mp6 does not change with variations on VCC.

Although not wishing to be barred by any particular theory of operation, an explanation of operation of the VCO 14 is as follows. With VIN referenced to VSS (circuit ground) and independent of the circuit's supply voltage VCC, the voltage control circuit 200 output VDR will be independent of VCC. Since VDR controls the output frequency of the oscillator 220, this frequency will also be independent of VCC. Because of its power supply independence, the output frequency of this VCO 14 is more immune to electrical noise on the circuit's power supply VCC, than other high frequency voltage controlled oscillators.

VIN controls VDR in the following manner. With VIN equal to zero volts, VDR goes to an offset voltage that is set by the amount of current from MP6 that is sourced through poly resistor RLP and the pull-down impedances of devices MNI and MN4 operating in the triode region. The current from MP6 produces a voltage at node LP3 that is applied to the gate of the source follower, MP3. Since the potential at the source of MP3 is VDR, VDR is equal to the voltage at node LP3 plus the Vgs of MP3. Thus, with VIN equal to zero volts, VDR will be at an offset voltage of approximately 1.2 volts and the oscillator 220 will operate at to an offset frequency of approximately 20 MegHz. When VIN is raised to a voltage equal to about a N-channel threshold voltage, device MN2 begins to turn on and starts to pull the voltage at node LP up. As node LP moves up in voltage, node LP3 and voltage VDR also move up. Thus, raising VIN raises VDR and raising VDR raises the frequency of the oscillator 220.

The current boost circuit ensures that node LP3 and voltage VDR can be pulled up to the highest possible voltage when VIN is equal to VCC. This circuit provides a parallel signal path to the input stage and consists of devices MNH3, MNH1, MNH2, MPH2, MPHI and poly resistor RH. When VIN reaches a value of approximately twice the N-channel threshold voltage, devices MNH3 and MNHI begin to turn on and current starts to flow through resistor RH. Transistor MNH2 replicates a current that is about one half of the value of current flowing in MNH1 and pulls this current from device MPH2. A current that is approximately equal to the current in MPH2 is then replica biased in device MPH1. The current from MPH1 then pulls node LP3 up and thus, also pulls up VDR and the frequency of the oscillator 220.

The output signal of the oscillator 220 will have varying frequencies and varying logic levels. To convert this signal to one with full CMOS logic levels while minimizing any duty cycle distortion, in another embodiment of the present invention, the high speed level shifting circuit 16 follows the VCO 14.

The level shifting circuit 16 includes an input stage 32, a bias current adjust circuit 34, and an output latch 36.

The input stage 32 of the level shifting circuit 16 includes two pre-amplifiers for receiving the complementary outputs, OUT and $\overline{\text{OUT}}$, of the oscillator 220. The first pre-amplifier includes a first N-channel input transistor MNT1 with a gate as the negative input. The source of the first input transistor MNTI connects to the circuit ground VSS, and its drain to the output of the first pre-amplifier. The output of the first pre-amplifier also connects to the drain of a first P-channel current source MPTI, and the gate and drain of a first diode connected N-channel load transistor MNT2. A bias voltage VB drives the gate of the first current source transistor MPT1. The second pre-amplifier includes a second input transistor MNT3 with a gate as the positive input, a second P-channel source MPT2, and a second diode connected load transistor MNT4 connected in the sam fashion as the first pre-amplifier.

The bias current adjust circuit 34 generates the bias voltage VB that drives the gates of current source transistors MPT1 and MPT2 of the pre-amplifiers. The circuit 34 includes a current adjust section made up of a diode connected N-channel transistors MNT7, a mirror transistor MNT8 with its gate connecting to the gate of the diode connected transistor MNT7, and a current adjust N-channel transistor MNT9 connecting a source of the mirror transistor MNT8 to the ground terminal VSS. An independent bias circuit (not shown) sets a bias voltage PB2 at the gate of a first bias transistor MPB2 with its drain connecting to a drain of the diode connected transistor MNT7. The voltage VB sets the amount of current in the current adjust section. The gate and drain of a second P-channel bias transistor MPT6 both connect to a drain of the mirror transistor MNT8, and provide the bias voltage VB for the pre-amplifiers.

The output latch 36 includes a first N-channel driver transistor MNT5 and a second N-channel driver transistor MNT6 that receive the outputs of the first and second pre-amplifiers at their gates respectively. The drains of the first and second driver transistors connect to the gates and drains of a cross-coupled pair of P-channel load devices MPT4 and MPT5. The output of the output latch 36, and the output of the level shifting circuit 16 connects to the drain of the first driver transistor MNT5.

The oscillator 220 operates with a supply potential VDR that varies between approximately 1.2 volts to [VCC−VDsat of MP2](4.7 volts nominal) and therefore, the value of the high logic level can vary between 1.2 volts and VCC −0.3 V.

The level shifting circuit 16 operates in the following manner. Complementary signals OUT and $\overline{\text{OUT}}$ from the VCO 14 are first amplified by the two high speed pre-amplifiers in the input stage 32. These pre-amplifiers are necessary in order to amplify the minimum high logic levels up to a value that is sufficient to drive the subsequent stages adequately. The outputs of the two gain stages are then fed into an output latch 36 which acts as a positive feedback latch. This output latch 36 converts the signals from the pre-amplifier outputs to full CMOS logic levels that vary between VSS (0 volts) and VCC (5.0 volts nominal).

To guarantee that the level shifting circuit 16 works satisfactorily with very high frequency, maximum high logic level signals as well as with lower frequency, minimum high logic level signals, a bias current adjust circuit 34 is added to the circuit. The bias current adjust circuit works as follows. As VDR increases, the output frequency of the oscillator 220 increases. At the same time a higher VDR at the gate of current adjust transistor MNT9 lowers the voltage at VB, which in turn raises the amount of pull-up current in load transistors MPT1 and MPT2 of the pre-amplifiers. Higher currents in the pre-amplifiers increase their speed, enabling them to handle higher frequency signals at their inputs.

The bias current adjust circuit 34 raises the current enough to allow the outputs of the pre-amplifiers to pull-up faster for higher speed operation, but at the same time not raising the pull-up current so high that input transistors MNTI and MNT3 are not able to pull their drains below an N-channel threshold. If the drains of the input transistors MNTI and MNT3 (outputs of the pre-amplifiers) cannot pull below an N-channel threshold, the subsequent output latch 36 will not change states at an adequate speed. The current adjust bias circuit 34 is designed such that current adjust transistor MNT9 operates with a drain-to-source voltage that is always less than an N-channel threshold. The sizes of the pre-amplifier input transistors MNTI and MNT3 are ratioed to that of the current adjust transistor MNT9, such that the outputs of the pre-amplifiers always pull below an N-channel threshold.

In conclusion, the present invention offers a high speed, power supply independent voltage controlled oscillator (VCO) in one embodiment, and a VCO with a high speed level shifting circuit in another. While the above is a complete description of the preferred embodiments of the present invention, it is possible to use various alternatives, modifications and equivalents. Therefore, the scope of the present invention should be determined not with reference to the above description but should, instead, be determined with reference to the appended claims, along with their full scope of equivalents.

What is claimed is:

1. A high speed voltage controlled oscillator comprising:
    a ring oscillator circuit coupled between a variable supply terminal and a grounding means, a variable voltage said variable supply terminal controlling a frequency of oscillation; and
    a voltage control circuit coupled between a fixed power supply terminal and a grounding means, having an input terminal referenced to a ground terminal and an output terminal coupled to said variable supply terminal;
    wherein a voltage at said input terminal controls a voltage at said variable supply terminal, substantially independently of said fixed power supply.

2. The high speed voltage controlled oscillator of claim 1 wherein said voltage control circuit further comprises:
    an input stage having an input terminal referenced to a ground terminal, a voltage at said input terminal controlling an offset voltage at a first terminal of a resistor;
    an output stage including a source-follower transistor receiving at a gate terminal said offset voltage, with a source terminal coupled to said output terminal; and
    a current boost circuit providing a parallel signal path to said input stage, said boost circuit increasing a voltage swing at said output terminal when an input voltage at said input terminal exceeds a determined value.

3. A high speed voltage controlled oscillator comprising:
    an input stage having an input terminal referenced to a ground terminal, a voltage at said input terminal controlling an offset voltage at a first terminal of a resistor;
    an output stage including a source-follower transistor receiving at a gate terminal said offset voltage, with a source terminal coupled to an output terminal;

a current boost circuit providing a parallel signal path to said input stage, said boost circuit increasing a voltage swing at said output terminal when an input voltage at said input terminal exceeds a determined value; and a ring oscillator circuit coupled between said output terminal and a grounding means, a voltage at said output terminal controlling a frequency of oscillation.

4. A high speed voltage controlled oscillator comprising:

a ring oscillator circuit coupled between a variable supply terminal and a grounding means and having a true and an inverted output, a variable voltage at said variable supply terminal controlling a frequency of oscillation;

a voltage control circuit coupled between a fixed power supply terminal and a grounding means, having an input terminal referenced to a ground terminal and an output terminal coupled to said variable supply terminal, wherein a voltage at said input terminal controls a voltage at said variable supply terminal, independently of said fixed power supply; and a level shifting circuit with variable speed having two inputs for receiving said ring oscillator true and inverted outputs, said level shifting circuit for converting said ring oscillator outputs with varying logic levels and varying speed to signals with full logic levels having low duty-cycle distortion.

5. The voltage controlled oscillator of claim 4 wherein said level shifting circuit further comprises:

a first and a second pre-amplifier for receiving said ring oscillator's true and inverted outputs respectively;

a positive feedback latch including two input transistors for receiving an output of said first pre-amplifier and an output of said second pre-amplifier, a cross-coupled pair of load transistors, and an output;

a bias current adjust circuit receiving said voltage control circuit output at a control input for adjusting an amount of current flowing in said first and second pre-amplifiers, wherein a higher voltage at said control input increases said amount of current for a higher speed of operation.

6. A high speed voltage controlled oscillator comprising:

an input stage having an input terminal referenced to a ground terminal, a voltage at said input terminal controlling an offset voltage at a first terminal of a resistor;

an output stage including a source-follower transistor receiving at a gate terminal said offset voltage, with a source terminal coupled to a variable supply terminal;

a current boost circuit providing a parallel signal path to said input stage, said boost circuit increasing a voltage swing at said output stage output when said input terminal voltage exceeds a determined value; and a ring oscillator circuit including an odd number of inverters, coupled between a variable supply terminal and a grounding means, with said variable supply terminal coupled to said output stage output;

a first and a second buffer inverter connected in series at an output of said ring oscillator circuit, said first and second buffer inverters for providing a true and an inverted outputs respectively;

a first and a second pre-amplifier for receiving and amplifying complementary outputs from said first and second buffer inverters true and inverted outputs; said first and second pre-amplifiers having a first and second outputs;

a positive feedback latch including two input transistors receiving said first and second outputs, a cross-coupled pair of load transistors, and an output; and a bias current adjust circuit having a control input coupled to said variable supply terminal, a voltage at said control input adjusting an amount of current flowing in said first and second pre-amplifiers;

wherein a voltage at said input terminal controls a voltage at said variable supply terminal for setting a frequency of operation, and a higher voltage at said variable supply terminal increases said amount of current flowing in said first and second pre-amplifiers for a higher speed of operation.

7. A high speed level shifting circuit comprising:.

a first pre-amplifier having an input terminal of first polarity and a first output;

a second preamplifier having an input terminal of an opposite polarity and a second output;

an output stage having first and second inputs coupled to said pre-amplifiers' first and second outputs, and including a positive feedback latch having a circuit output; and a bias current adjust circuit having a control input and a bias voltage output, said bias voltage output adjusting a bias current for said first and second pre-amplifiers.

8. The high speed level shifting circuit of claim 7 wherein said positive feedback latch includes two input transistors and two cross-coupled load transistors.

9. A high speed level shifting circuit comprising:

a first pre-amplifier having an input terminal of first polarity and a first output;

a second pre-amplifier having an input terminal of opposite polarity and a second output;

an output stage including a positive feedback latch having two input transistors for receipt of said pre-amplifiers' first and second outputs, two cross-coupled load transistors, and a circuit output; and a bias current adjust circuit having a control input and a bias voltage output, said bias voltage output adjusting a bias current for said first and second pre-amplifiers;

wherein a higher voltage at said control input increases said bias current for said first and second preamplifiers for a higher speed of operation, and said positive feedback latch converts input signals having varying logic levels to a signal with full logic level having low duty-cycle distortion.

* * * * *